United States Patent [19]

Ishida

[11] Patent Number: 5,240,559
[45] Date of Patent: Aug. 31, 1993

[54] DRY ETCHING METHOD OF COPPER OR COPPER ALLOY INTERCONNECTION LAYER EMPLOYING PLASMA OF AN IODINE COMPOUND

[75] Inventor: Tomoaki Ishida, Hyogo, Japan

[73] Assignee: Mitsubishi Denki Kabushiki Kaisha, Tokyo, Japan

[21] Appl. No.: 871,769

[22] Filed: Apr. 21, 1992

[30] Foreign Application Priority Data

May 1, 1991 [JP] Japan .................. 3-100074

[51] Int. Cl.$^5$ .................. C23F 1/02; H01L 21/44
[52] U.S. Cl. .................. 456/666; 156/643; 437/190; 437/192; 437/245
[58] Field of Search .............. 156/666, 643; 437/190, 437/192, 245

[56] References Cited

U.S. PATENT DOCUMENTS 3,994,793 11/1976 Harvilchuck et al. .......... 156/646
4,557,796 12/1985 Druschke et al. ............ 156/666
5,100,499 3/1992 Douglas .................... 156/643

OTHER PUBLICATIONS

Cuomo et al., "Reactive Ion Etching of Copper"; IBM Tech. Disclosure Bulletin, vol. 25, No. 12, May 1983; pp. 6394.

*Primary Examiner*—Brian E. Hearn
*Assistant Examiner*—Trung Dang
*Attorney, Agent, or Firm*—Lowe, Price, LeBlanc & Becker

[57] ABSTRACT

The present invention is mainly characterized by obtaining a dry etching method which is improved to obtain a copper interconnection pattern with high dimensional accuracy. A resist pattern is formed on a copper interconnection layer formed on a substrate. Using the resist pattern as a mask, the copper interconnection layer is etched with plasma of an iodine type compound selected from the group consisting of HI, $I_2$, $BI_3$ and $SiI_4$.

10 Claims, 6 Drawing Sheets

DRY ETCHING METHOD OF COPPER OR COPPER ALLOY INTERCONNECTION LAYER EMPLOYING PLASMA OF AN IODINE COMPOUND

BACKGROUND OF THE INVENTION

1. Field of the Invention

The present invention relates generally to dry etching methods of interconnection layers and more particularly to a dry etching method for interconnection layers which is improved so that a sufficient etching rate can be obtained without heating substrates to high temperature.

2. Description of the Background Art

With development of higher integration, higher performance and higher speed of semiconductor devices, metal film interconnections in semiconductor devices (LSI, for example) are increasingly miniaturized. With miniaturization of the metal film interconnection, the density of current flowing in the metal film interconnection is on a steady increase recently. As a result, for the reliability demanded for the metal film interconnection, that is, electromigration resistance and stress migration resistance, extremely high characteristics are demanded. Accordingly, materials of the metal film interconnection are also under development.

For example, describing a dynamic random access memory (DRAM), before units of 156Kbit were developed, aluminum-silicon alloy (AlSi) has been employed for the metal film interconnection. In the generation of 1 Mbit-16 Mbit, in order to enhance the electromigration resistance and the stress migration resistance, Al-SiCu alloy to which copper is added is employed for the metal film interconnection. Under such conditions, in the generation of 64 Mbit or larger, because of demand for further improvement in the reliability, it is almost sure that interconnection employing copper or copper alloy will be employed.

Accordingly, for manufacturing DRAMs of 64 Mbit or larger, development in the fine processing technology of Cu and Cu alloy films is essential.

However, the fine processing technology of Cu and Cu alloy films, that is, the dry etching technology has not been satisfactory. Although a copper dry etching method employing methyl iodide has been proposed, as one relating to the present invention (Japanese Patent Laying-Open No. 60-86285), it is not satisfactory as will be described later referring table 1.

Figure 4A:
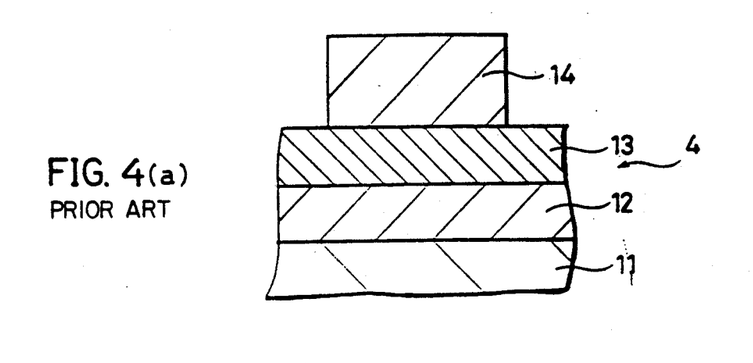
FIGS. 4(a)-(c) are a partial sectional view of a semiconductor device in order of respective steps in a conventional etching method of a copper interconnection layer.
Figure 4B:
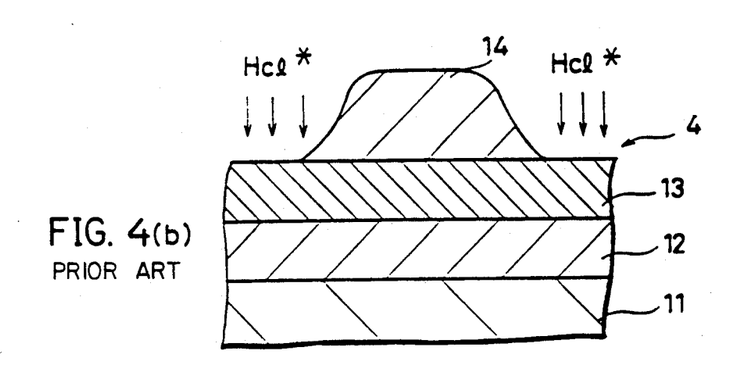
Figure 4C:
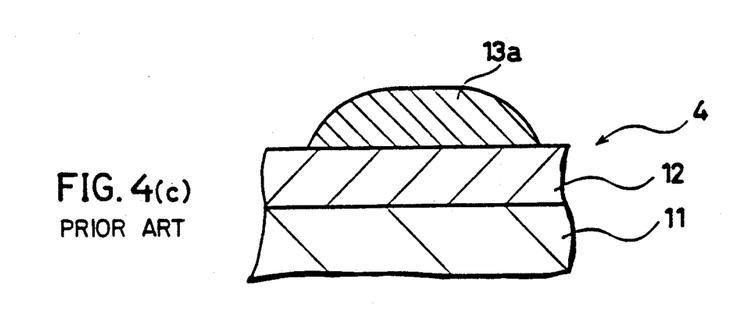
Figure 5:
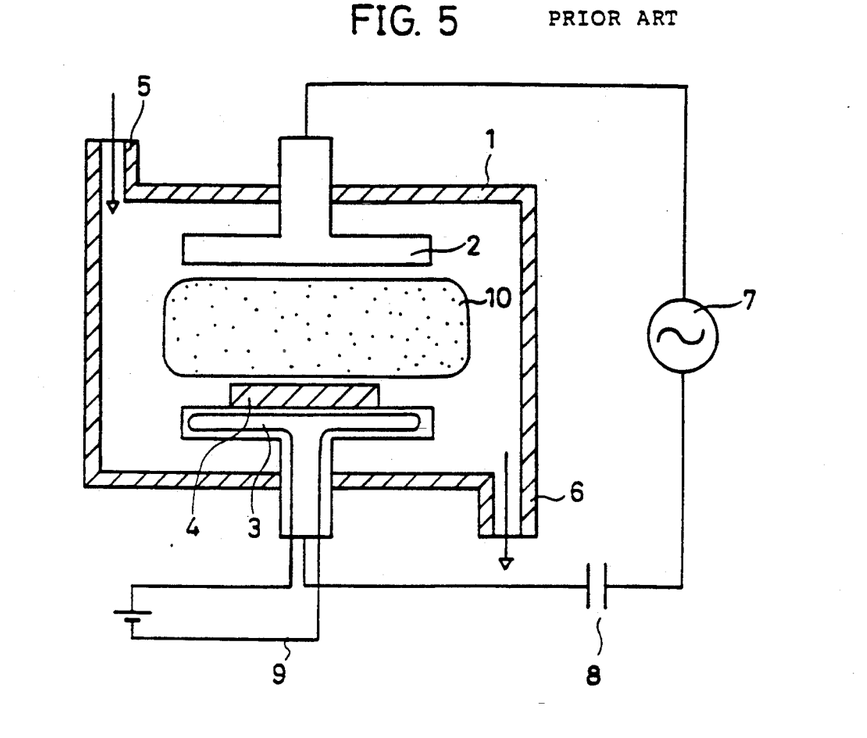
FIG. 5 is a schematic diagram of a reactive ion etching apparatus.

FIG. 4 is a partial sectional view of a semiconductor device in order of respective steps in a conventional dry etching method for Cu or Cu alloy films. FIG. 5 is a schematic diagram of a reactive ion etching device for implementing the dry etching. Before describing the conventional dry etching method shown in FIG. 4, the structure of the reactive ion etching apparatus shown in FIG. 5 will be described first.

Referring to FIG. 5, the reactive ion etching device includes a hollow processing container 1. In the processing container 1, an upper plate high frequency electrode 2 and a lower plate high frequency electrode 3 arranged parallel to each other are provided. An exhaust port 6 for exhausting gas in processing container 1 to implement a vacuum condition inside processing container 1 is provided at a lower portion of processing container 1. A gas introducing port 5 is provided at an upper portion of processing container 1 for introducing reactive gas containing chlorine type gas as a main component into processing container 1. An output on one side of a high frequency power source 7 is directly connected to the upper plate high frequency electrode 2. The other side output of high frequency power source 7 is connected to the lower plate high frequency electrode 3 through a capacitor 8 for high frequency coupling.

Next, referring to FIGS. 4 and 5, a conventional dry etching method for Cu or Cu alloy films will be described.

Referring to FIG. 4(a), a substrate to be processed 4 (hereinafter, referred to as a substrate 4) is prepared. The substrate 4 includes a silicon substrate 11, a silicon oxide film 12 (interlayer insulating film) provided on silicon substrate 11, an interconnection layer 13 formed of a Cu or Cu alloy film provided on silicon oxide film 12, and a resist pattern 14 provided on interconnection layer 13, for example.

Referring to FIG. 5, substrate 4 is carried on lower plate high frequency electrode 3. Next, a chlorine type reactive gas (e.g., HCl) is introduced into processing container 1 from gas introducing port 5 and simultaneously the gas is exhausted from exhausting port 6 to maintain predetermined pressure in processing container 1. A heater 9 is operated to keep lower plate high frequency electrode 3 and substrate 4 at predetermined temperature of 200° C. or higher. The condition of substrate 4 at that time is shown in FIG. 4(b).

High frequency voltage coming from high frequency power source 7 is applied between lower plate high frequency electrode 3 and upper plate high frequency electrode 2 to produce plasma 10 of the reactive gas in processing container 1.

When plasma 10 is produced in processing container 1, lower plate high frequency electrode 3 is charged of negative potential and reactive ions produced in plasma 10 are accelerated by the potential to impinge upon substrate 4. Neutral radical molecules produced in plasma 10 also diffuse in the plasma to reach the substrate 4 surface. The chlorine type reactive ions and neutral radical reached the surface of substrate 4 react with Cu or Cu alloy at a portion not covered with resist pattern 14 to give reaction product mainly containing $CuCl_x$, referring to FIG. 4(b). Substrate 4 is heated to temperature of 200° C. or higher and the temperature of the surface of substrate 4 is as high as several hundreds °C., the reaction product containing $CuCl_x$ as main component is evaporated to be removed from the surface of substrate 4. The etching of interconnection layer 13 using resist 14 as a mask thus proceeds.

Referring to FIGS. 4(b) and (c), removing resist pattern 14, interconnection pattern 13a of the Cu or Cu alloy is formed.

The conventional dry etching of Cu or Cu alloy has been performed employing plasma of chlorine type gas as described above. Accordingly, the vapor pressure of the obtained reaction product ($CuCl_x$) is low, and substrate 4 had to be heated to 200° C. or higher for obtaining a practical etching rate.

However, when substrate to be processed 4 is heated to 200° C. or higher, as shown in FIG. 4(b), there has been a problem that the resist pattern 14 is melted and thus deformed due to the heat. When resist pattern 14 changes in its shape as shown in the figure, referring to FIG. 4(c), the sectional shape of interconnection pattern 13a is taper-shaped in the upward direction, which has been a problem in view of accuracy. Also, there has been a problem that the removal of resist pattern 14 after finishing etching becomes impossible.

Figure 6A:
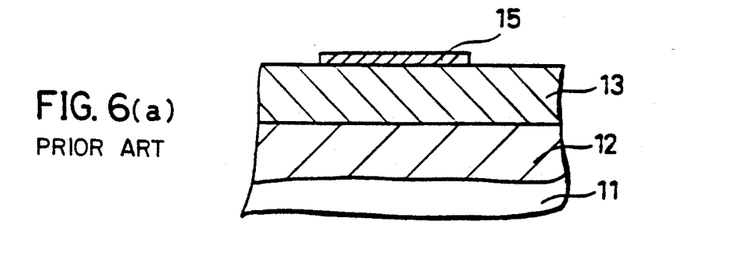
FIGS. 6(a)-(b) are a partial sectional view of a semiconductor device in order of respective steps in a conventional dry etching method for a copper interconnection layer using a silicon oxide film as a mask.
Figure 6B:
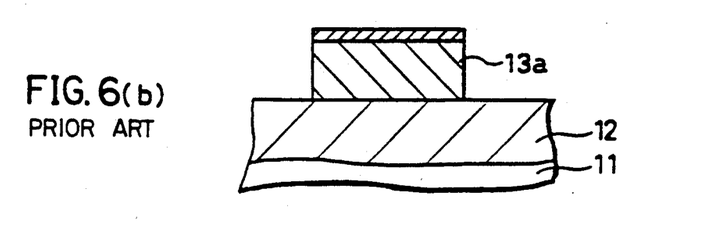

As a method of solving the problem of deformation of resist pattern 14 by heat, the method of etching a Cu or Cu alloy employing a silicon oxide film as a mask shown in FIG. 6 is known.

That is, referring to FIG. 6(a), an interlayer insulating film 12 and a Cu or Cu alloy interconnection layer 13 are formed on a silicon substrate 11. A pattern 15 of a silicon oxide film is formed on Cu or Cu alloy interconnection layer 13.

Referring to FIG. 6(b), while heating silicon substrate 11 to the temperature of 200° C. or higher, using pattern 15 of the silicon oxide film as a mask, Cu or Cu alloy interconnection layer 13 is patterned with plasma of chlorine type gas. By this method, the heat resistance of pattern 15 of the silicon oxide film is good, so that pattern 15 is not changed in its shape even if the substrate is heated to 200° C. or higher. Accordingly, an interconnection pattern of the Cu or Cu alloy with high accuracy in which the side wall is perpendicular to the substrate can be obtained.

However, the method requires a step of forming pattern 15 of a silicon oxide film, resulting in problems of an increase in the number of manufacturing steps and an increase in manufacturing cost accordingly.

SUMMARY OF THE INVENTION

It is an object of the present invention to provide a method which is improved so that a copper interconnection layer is dry-etched at relatively low temperature.

It is another object of the present invention to provide a method which is improved so that a copper alloy interconnection layer is dry-etched at relatively low temperature.

It is still another object of the present invention to provide a method which is improved so that an interconnection layer having lamination film structure including a copper layer is dry-etched at relatively low temperature.

It is yet another object of the present invention to provide a method which is improved so that an interconnection layer including copper or copper alloy can be dry-etched without increasing the number of manufacturing steps.

In a dry etching method of a copper interconnection layer formed on a substrate according to the present invention, a resist pattern is first formed on the copper interconnection layer. Using the resist pattern as a mask, the copper interconnection layer is etched by plasma of an iodine type compound selected from the group consisting of HI, $I_2$, $BI_3$ and $SiI_4$.

In a method of dry-etching a copper alloy interconnection layer provided on a substrate according to another aspect of the present invention, a resist pattern is formed on the copper alloy interconnection layer in the first place. Using the resist pattern, the copper alloy interconnection layer is etched by plasma of mixed gas containing an iodine type compound selected from the group consisting of HI, $I_2$, $BI_3$ and $SiI_4$ and chlorine type compound, using the resist pattern.

In a dry etching method of an interconnection layer having lamination film structure including a copper layer provided on a substrate according to still another aspect of the present invention, a resist pattern is first formed on the interconnection layer having the lamination structure including the copper layer. Using the resist patter as a mask, the interconnection layer of the laminated film structure is dry-etched with plasma of mixed gas containing an iodine type compound selected from the group consisting of HI, $I_2$, $BI_3$ and $SiI_4$ and a chlorine type compound.

According to a dry etching method of a copper interconnection layer according to the present invention, dry etching is performed with plasma of an iodine type compound. $CuI_x$ produced by the reaction of a copper interconnection layer and an iodine type compound has its vapor pressure higher than that of $CuCl_x$, so that the dry etching can be performed at temperature lower than that in a conventional dry etching method using chlorine type gas plasma.

According to a dry etching method of a copper alloy interconnection layer according to another aspect of the present invention, dry etching is performed with plasma of mixed gas containing an iodine type compound and a chlorine type compound. Since $CuI_x$ produced by the reaction between the copper alloy interconnection layer and the iodine type compound has its vapor pressure higher than $CuCl_x$, dry etching can be performed at temperature lower than that in a conventional dry etching method using chlorine type gas plasma only.

According to a dry etching method of an interconnection layer having laminated film structure including a copper layer according to still another aspect of the present invention, dry etching is performed with plasma of mixed gas containing an iodine type compound and a chlorine type compound. Since $CuI_x$ produced by the reaction of the copper layer and the iodine type compound has its vapor pressure higher than that of $CuCl_x$, as compared to a conventional etching method using plasma of chlorine type gas only, the dry etching can be performed at lower temperature.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be described below referring to the figures.

Figure 1A:
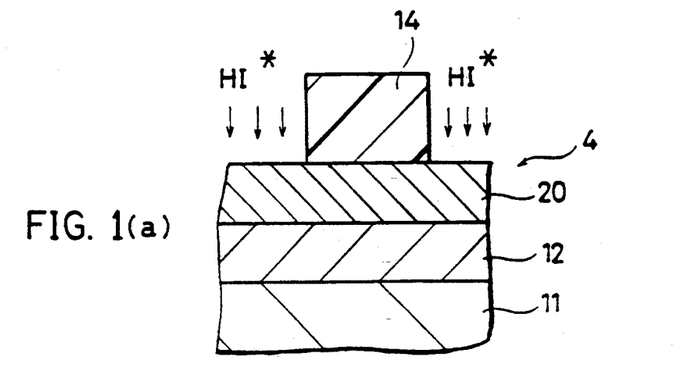
FIGS. 1(a)-(c) are a partial sectional view of a semiconductor device in order of the respective steps in a manufacturing method according to one embodiment of the present invention.
Figure 1B:
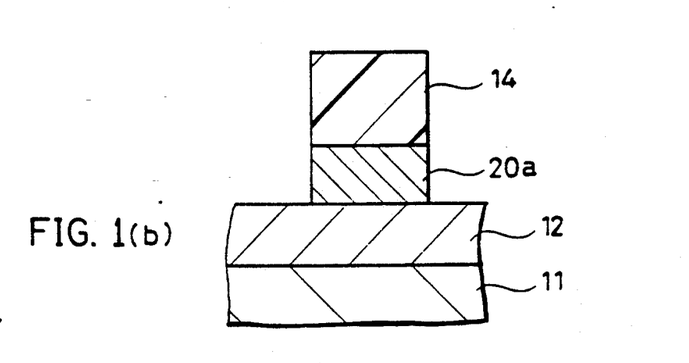
Figure 1C:
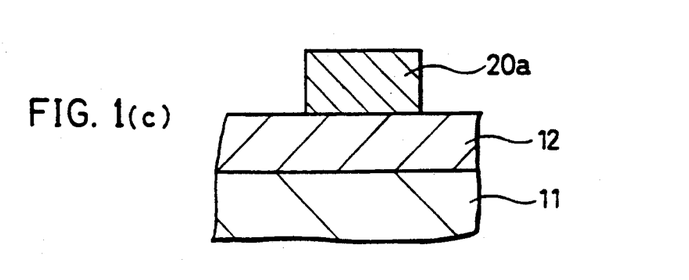

FIG. 1 is a partial sectional view of a semiconductor device in respective steps in order of a manufacturing method according to an embodiment of the present invention. As a dry etching apparatus, the conventional reactive ion etching apparatus shown in FIG. 5 is employed.

Referring to FIG. 1(a), an interlayer insulating film 12 is formed on a silicon substrate 11. A copper interconnection layer 20 is formed on an interlayer insulating film 12. A resist patter 14 is formed on copper interconnection layer 20.

Substrate 4 on which resist pattern 14 is formed is provided on a lower plate high frequency electrode 3 referring to FIG. 5. Substrate 4 is heated by a heater 9 to a predetermined temperature of 100° C. or lower. Next, a hydrogen iodide gas is introduced into processing container 1 from gas introducing port 5 and simultaneously the gas is exhausted from exhausting port 6. The hydrogen iodide gas is introduced into processing container 1 at flow rate of 50-500SCCM, preferably 300SCCM. The pressure inside processing container 1 is made 50-400 mTorr, preferably 200 mTorr. In this condition, using a high frequency power source 7, high frequency voltage is applied between lower plate high frequency electrode 3 and upper plate high frequency electrode 2. The applied high frequency power is 200-600 W, preferably 400 W. Applying the high frequency voltage between lower plate high . frequency electrode 3 and upper plate high frequency electrode 2, plasma 10 of the hydrogen iodide gas is generated as shown in the expression below.

$$HI \rightarrow (HI)^*$$

When plasma 10 is produced between lower plate high frequency electrode 3 and upper plate high frequency electrode 2, lower plate high frequency electrode 3 is charged of negative potential and the reactive ions of iodine produced in plasma 10 are accelerated by the potential to be incident on substrate 4. Neutral radical molecules of iodine type produced in the plasma 10 also diffuse in plasma 10 to reach the substrate 4 surface. The iodine type reactive ions or the neutral radical which reached the substrate 4 surface, referring to FIG. 1(a), react with Cu on the surface of copper interconnection layer 20 which is not covered with resist patter 14 to produce a reaction product containing $CuI_x$ as a main component.

Figure 2:
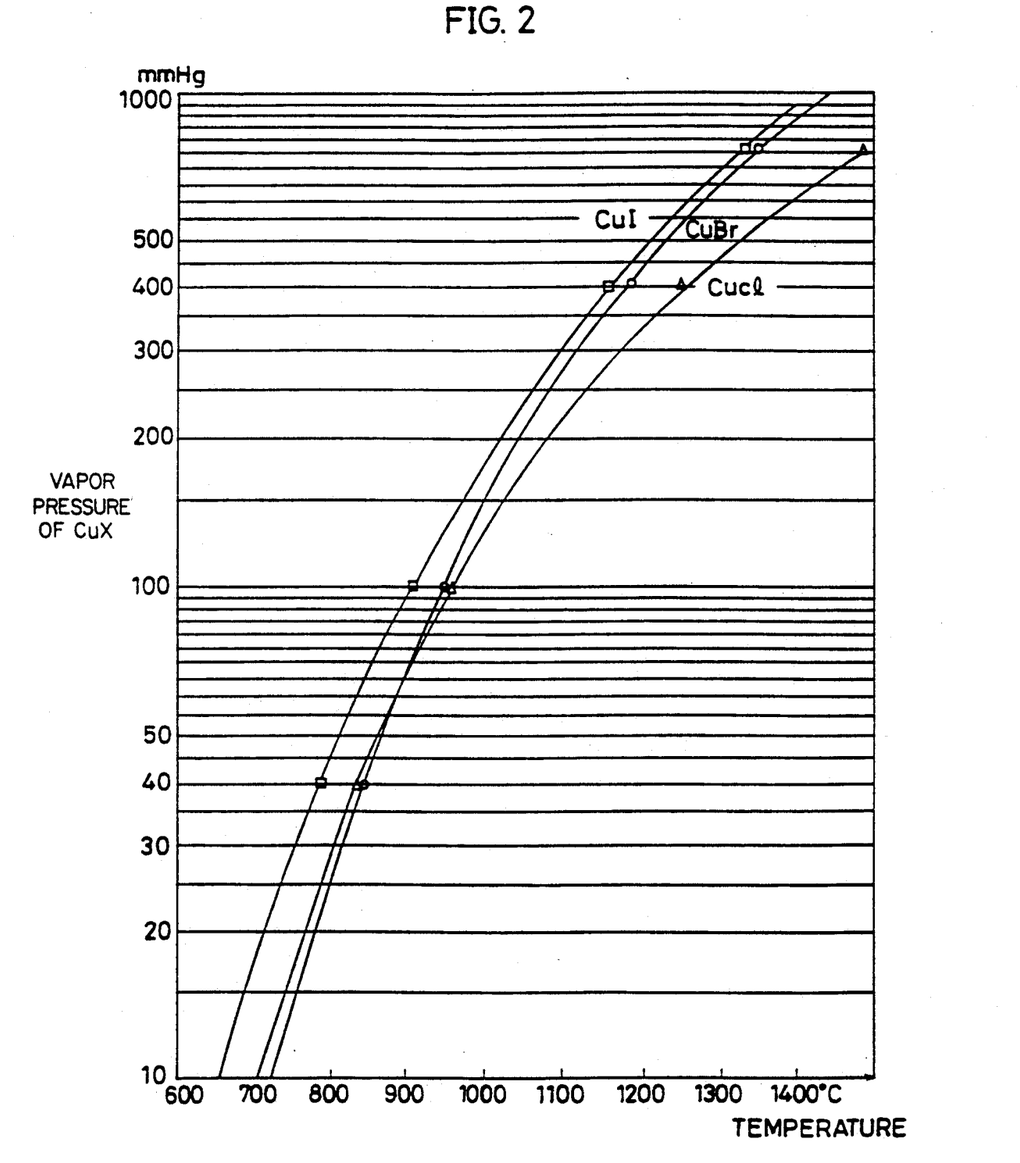
FIG. 2 is a diagram of vapor pressure curves of CuI, CuBr and CuCl.

The vapor pressure of the product $CuI_x$ is higher than the vapor pressure of a reactive product $CuCl_x$ according to the conventional method (refer to FIG. 2). Silicon substrate 11 is kept at temperature of 100° C. or lower, but the surface temperature of copper interconnection layer 20 is locally 600° C. or higher due to the ion incidence. In the temperature range of 600° C. or higher, vapor pressure of $CuI_x$ at a certain temperature of 600° C. or higher is approximately same as the vapor pressure of $CuCl_x$ at temperature higher than the certain temperature by approximately 100° C. This means that, using plasma of a hydrogen iodide gas for dry etching of copper interconnection layers, as compared to a conventional dry etching using plasma of a chlorine type gas, the temperature for heating the substrate can be made lower by 100 through 200° C.

That is to say, using plasma of a HI gas for dry etching of a copper interconnection layer, with heater 9 set at temperature of 200° C. or lower, an etching rate enough for use can be obtained.

Etching rates in cases where various gases are employed are listed in table 1. In the table 1, the dry etching method of copper using methyl iodide is the art disclosed in Japanese Patent Laying-Open No. 60-86285.

TABLE 1

| Etching Rates When Employing Various Gas Species | |
|---|---|
| Gas Species | Etching Rate (Å/min) |
| HCl | 20 |
| $CH_3I$ | 500 |
| HI | 3500 |
| $BI_3$ | 2600 |
| $SiI_4$ | 1800 |
| $I_2$ | 3200 |
| RF: | 13.56 MHz |
| Temperature of Heating Substrate: | 100° C. |
| PF Power | 400 W |
| Gas Flow Rate | 300 SCCM |
| Pressure | 200 mTorr |

As clearly seen from table 1, using HI, $BI_3$, $SiI_4$, $I_2$ gases, a large etching rate could be obtained as compared to cases in which HCl or $CH_3I$ gas was used.

The reason why the etching rate is not high when using $CH_3I$ will be described below.

Figure 7:
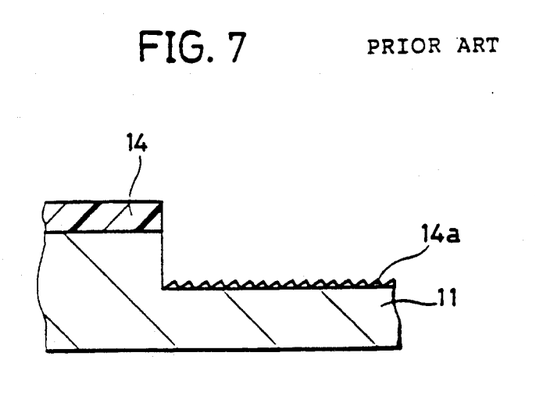
FIG. 7 is a diagram illustrating a case in which $CH_3I$ is used as an etching gas.

FIG. 7 is a cross-sectional view illustrating conditions of dry etching of substrate 11 using a pattern of resist 14 as a mask and also using a $CH_3I$ gas.

As shown in the figure, using a $CH_3I$ gas, remains 14a of the resist attach on the surface of substrate 11.

It is considered that, in etching, the remains 14a act as an obstruction to decrease the etching rate.

Since HI, $BI_3$, $SiI_4$, $I_2$ contain no carbon atoms, no such remains of resist are not produced.

Furthermore, as clearly seen from Table 1, a hydrogen iodide gas provides a especially large etching rate, so that it is the most preferable as an etching gas used in the present invention.

Using plasma of hydrogen iodide gas for dry etching of copper interconnection layers, even if heater 9 is set to 200° C. or lower, an etching rate sufficient for use can be obtained.

Using a hydrogen iodide gas, substrate 11 does not have to be heated to temperature of 200° C. or higher, so that resist pattern 14 does not suffer thermal modification, as shown in FIGS. 1(a) and (b).

Referring to FIG. 1(b), as the dry etching of a copper interconnection layer proceeds with the pattern shape of resist 14 maintained in a good condition, the accuracy of patterning the copper interconnection layer 20 is high.

As a result, referring to FIG. 1(c), removing resist 14, a copper interconnection pattern 20a with high preciseness in dimension in which the sidewalls are formed vertical to the substrate can be obtained.

Although a hydrogen iodide gas was illustrated as a reactive gas in the above-described embodiment, the present invention is not limited to the same, and $I_2$, $BI_3$, $SiI_4$ or $CI_4$ can be also preferably used.

Also, though a case where hydrogen iodide is used for etching of a copper interconnection layer has been illustrated in the above-described embodiment, when dry-etching an interconnection layer formed of copper alloy such as Cu-Al, Cu-Al-Si, a mixed gas containing an iodine type compound selected from the group consisting of HI, $I_2$, $BI_3$, $SiI_4$ and $CI_4$ and a chlorine type compound (e.g. HCl, $Cl_2$) is preferably used. 50 volume % or more of an iodine type compound, preferably 50–80 volume % is preferably included in the mixed gas. When etching Cu-Al alloy using such a mixed gas, Cu is etched by the reactive ions of iodine and Al is etched by the reactive ions of chlorine. As described above, when etching Cu with iodine, etching at temperature lower than that in etching only with chlorine is enabled.

Figure 3A:
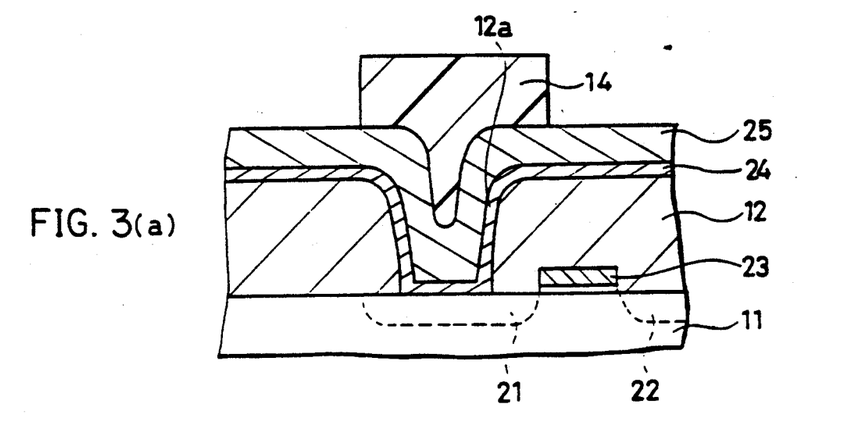
FIGS. 3(a)-(c) are a partial sectional view of a semiconductor device in order of respective steps in a manufacturing method according to another embodiment of the present invention.
Figure 3B:
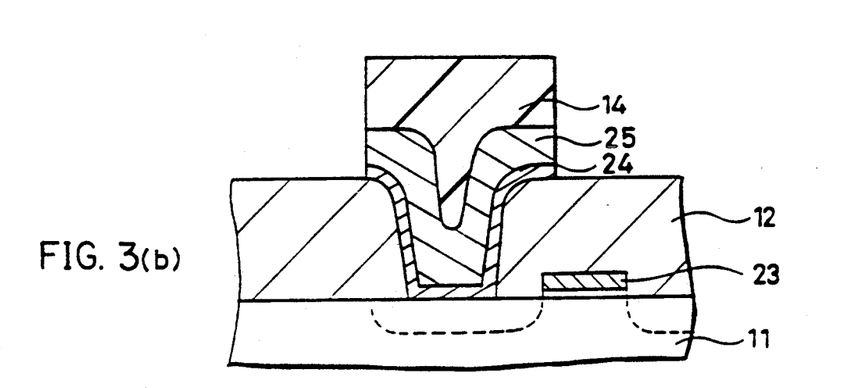
Figure 3C:
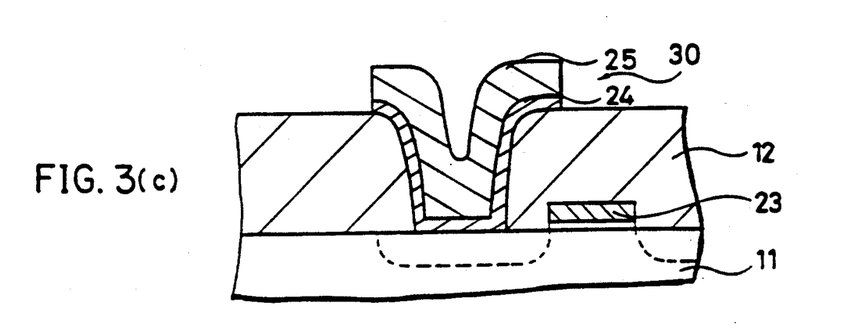

FIG. 3 is a partial sectional view of a semiconductor device in respective steps in order of a dry etching method of an interconnection layer having laminated film structure including a copper layer according to another embodiment of the present invention.

Referring to FIG. 3(a), a gate electrode 23 is formed on a silicon substrate 11. A source region 21/drain region 22 is formed on both sides of gate electrode 23 on a main surface of substrate 11. Covering gate electrode 23, an interlayer insulating film 12 is formed on substrate 11. A contact hole 12a is formed for exposing a part of source region 21 in interlayer insulating film 12. Coating sidewall surfaces and bottom surface of contact hole 12a, a barrier metal 24 is formed. For barrier metal 24, Ti, TiN, W, TiW and so fourth are employed. A copper or copper alloy layer 25 is formed on barrier metal 24. Barrier metal 24 is for preventing the copper from diffusing in source region 21.

A resist pattern 14 having predetermined shape is formed on copper or copper alloy layer 25.

Referring to FIG. 3(b), using resist pattern 14 as a mask, barrier metal layer 24 and copper or copper alloy layer 25 are dry-etched with plasma of a mixed gas containing an iodine type compound selected from the group consisting of HI, $I_2$, $BI_3$ and $SiI_4$ and a chlorine type compound. In this case, silicon substrate 11 is heated to a predetermined temperature of 200° C. or lower, preferably 100° C. or lower. Performing dry etching using such a mixed gas, the copper is etched by reactive ions of the iodine and barrier metal layer 24 is etched by plasma of the chlorine type compound. As described above, using an iodine type gas, since substrate 11 does not have to be heated to temperature of 200° C. or higher, resist pattern 14 is not deformed by the heat. The dry etching proceeds with the pattern shape of resist pattern 14 maintained in a good condition, so that the preciseness of patterning of the copper or copper alloy interconnection layer and barrier metal layer 24 is high.

As a result, referring to FIG. 3(c), removing resist pattern 14, an interconnection pattern 30 with high dimensional accuracy can be obtained.

As described above, according to a dry etching method of a copper interconnection layer according to the present invention, dry etching is performed with plasma of an iodine compound. $CuI_x$ produced by reaction of a copper interconnection layer and an iodine compound has its vapor pressure higher than that of $CuCl_x$, so that dry etching can be performed at temperature lower than that in a conventional etching using gas plasma of chlorine type. Accordingly, the substrate do not have to be heated to temperature of 200° C. or higher. As a result, the dry etching proceeds with the pattern shape of the resist maintained in a good condition, an effect is produced that the preciseness in patterning the copper interconnection layer increases.

According to a dry etching method of a copper alloy interconnection layer according to another aspect of the present invention, dry etching is performed for a copper alloy interconnection layer with plasma of a mixed gas containing an iodine type compound and a chlorine type compound $CuI_x$ produced by reaction of the copper and an iodine type compound has its vapor pressure higher than that of $CuCl_x$, so that dry etching can be performed at lower temperature as compared to conventional etching using only a chlorine type compound. Consequently, a copper interconnection layer with high dimensional accuracy can be obtained with the effect same as that in the case of the above-described copper insulating layer.

According to a dry etching method of an interconnection layer having lamination film structure including a copper layer according to still another aspect of the present invention, dry etching is performed with plasma of a mixed gas containing an iodine type compound and a chlorine type compound. $CuI_x$ produced by reaction between the copper and the iodine type compound has its vapor pressure higher than that of $CuCl_x$, so that dry etching can be performed at lower temperature as compared to a conventional dry etching method using only a chlorine type compound. As a result, by the same effect described in the above described dry etching method of a copper insulating layer, an effect is conducted that an interconnection pattern having lamination film structure with high dimensional preciseness is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dry etching method for a copper interconnection layer formed on a substrate, comprising the steps of:
    forming a resist pattern on a copper interconnection layer; and
    etching said copper interconnection layer with plasma of an iodine type compound selected from the group consisting of HI, $I_2$, $BI_3$ and $SiI_4$ using said resist pattern as a mask.

2. The method according to claim 1, wherein said iodine compound is HI.

3. The method according to claim 1, wherein said etching is performed while maintaining temperature of said substrate at 200° C. or lower.

4. A dry etching method of a copper alloy interconnection layer provided on a substrate, comprising the steps of:
    forming a resist pattern on the copper alloy interconnection layer; and
    etching said copper alloy interconnection layer with plasma of a mixed gas containing an iodine type compound selected from the group consisting of HI, $I_2$, $BI_3$ and $SiI_4$ and a chlorine type compound using said resist pattern as a mask.

5. The method according to claim 4, wherein said iodine type compound is HI.

6. The method according to claim 4, wherein said mixed gas contains said iodine type compound of 50 volume % or more.

7. The method according to claim 6, wherein said mixed gas contains said iodine type compound of 50–80 volume %.

8. The method according to claim 4, wherein said copper alloy comprises Cu-Al alloy or Cu-Al-Si alloy.

9. A dry etching method of an interconnection film having lamination film structure including a copper layer provided on a substrate, comprising the steps of:
 a resist pattern on the interconnection layer of the lamination structure including a copper layer; and
 dry-etching said interconnection layer of the lamination film structure with plasma of a mixed gas containing an iodine type compound selected from the group consisting of HI, $I_2$, $BI_3$ and $SiI_4$ and a chlorine type compound.

10. The method according to claim 8, wherein the interconnection layer of said lamination film structure includes a Ti layer, a TiN layer, a W layer or a TiW layer in addition to said copper layer.

* * * * *